United States Patent [19]

Heller

[11] 4,039,978

[45] Aug. 2, 1977

[54] LOGIC CONTROLLED CHARGE TRANSFER DEVICE TRANSVERSAL FILTER EMPLOYING SIMPLE WEIGHTING

[75] Inventor: Lawrence Griffith Heller, Brewster, N.Y.

[73] Assignee: International Business Machines Corporation, Armonk, N.Y.

[21] Appl. No.: 676,037

[22] Filed: Apr. 12, 1976

[51] Int. Cl.² .................. H03H 7/28; G11C 11/40; H03K 25/02; H03H 7/14
[52] U.S. Cl. .......................... 333/70 T; 307/221 D; 328/167
[58] Field of Search .................. 333/70 T, 18, 28 R; 307/221 D; 328/167; 235/181, 196, 152

[56] References Cited

U.S. PATENT DOCUMENTS

| | | | |
|---|---|---|---|
| 3,054,073 | 9/1962 | Powers | 333/70 T X |
| 3,292,110 | 12/1966 | Becker et al. | 333/18 |
| 3,819,958 | 6/1974 | Gosney | 357/24 X |
| 3,935,439 | 1/1976 | Buss et al. | 357/24 X |

Primary Examiner—Alfred E. Smith
Assistant Examiner—Marvin Nussbaum
Attorney, Agent, or Firm—John J. Goodwin

[57] ABSTRACT

A transversal filter structure employing charge transfer techniques which are embodied in charge-coupled-devices although bucket brigade devices may also be used. In the structure an input analog signal is time sampled and for each sample a sequence of charge packets $Q/2, Q/4, Q/8 \ldots Q/2^n$ is generated. Each sequence of charge packets is entered into a serial charge-coupled-device register and each separate charge packet is then entered into a plurality of $n$ parallel charge-coupled-device registers according to the fractional distribution, i.e. $Q1/2, Q2/2, Q3/2 \ldots Qk/2$ in one register, $Q1/4, Q2/4, Q3/4 \ldots Qk/4$ in another register, up to $Q1/2^n, Q2/2^n, Q3/2^n \ldots Qk/2^n$ in a last register. The charge packets in the parallel registers represent the time sampled analog input signal divided by $1, 2, 4, 8, \ldots 2^n$ respectively, and tap weights of $+1, -1$ and $0$ are applied by means of logic control and FET switches. The tap weights are bussed together, summed and differenced and the difference signal is the filter output signal.

7 Claims, 3 Drawing Figures

LOGIC CONTROLLED CHARGE TRANSFER DEVICE TRANSVERSAL FILTER EMPLOYING SIMPLE WEIGHTING

BACKGROUND OF THE INVENTION

1. Field of the Invention

The present invention relates to the transversal filter art, and more particularly to a logic controlled transversal filter using charge transfer structures such as charge-coupled-devices or bucket brigade devices.

2. Description of the Prior Art

The use of charge transfer devices for transversal filtering has been taught in the prior art, for example, in the publication "Transversal Filtering Using Charge-Transfer Devices" by Dennis D. Buss, Dean R. Collins, Walter H. Bailey, and C. Richard Reeves, IEEE J. Solid- State Circuits, Vol. SC-8, No. 2 April 1973, pp 138–146. This publication presents techniques for making transversal filters using charge-coupled devices and bucket-brigade devices. In the charge-coupled device transversal filter, the delayed signals are sampled by measuring the current flowing in the clock lines during transfer, and the sampled signals are weighted by a split electrode technique. In the bucket brigade transversal filter, the delayed signals are "tapped" with a source follower whose load determines the weighting coefficient.

The transversal filters described in the cited publication require precise tap weights over a wide range of values which is difficult to achieve using the split electrode described or other known techniques. The transversal filter of the present invention requires only weighting of +1, −1 and 0 and additionally can be programmed, that is, logic controlled.

Another example of an analog filter using charge transfer techniques is U.S. Pat. 3,819,958 issued June 25, 1974 to Gosney on an application filed Nov. 3, 1972 and assigned to Texas Instruments, Incorporated. The filter described in the cited patent also requires completed weighting, incorporates the split electrode technique, and is not logic controlled.

In addition, there are copending patent applications assigned to the present assignee which describe certain specific devices and techniques which are incorporated in the present invention. U.S. application Ser. No. 625,425 describes a charge packet replicator, U.S. patent applications Ser. Nos. 662,626 and 670,781 describe charge packet generators, and U.S. patent application Ser. No. 636,862 describes a circuit for injecting charge packets into an input circuit.

SUMMARY OF THE INVENTION

An object of the present invention is to provide an improved transversal filter employing charge-transfer structure.

Another object of the present invention is to provide an improved charge transfer transversal filter requiring simple weighting.

A further object of the present invention is to provide an improved charge transfer transversal filter which is controlled by programmed logic.

Still another object of the present invention is to provide an improved charge transfer transversal filter using a charge redistribution circuit to provide a precision divide-by-2 feature.

The foregoing and other objects, features and advantages of the invention will be apparent from the following more particular description of a preferred embodiment of the invention, as illustrated in the accompanying drawings.

DETAILED DESCRIPTION OF THE INVENTION

A filter can be characterized in the frequency domain(s) by a transfer function $H(s)$ wherein the output $V_o(s)$ is related to the input $V_i(s)$ by the expression $$V_o(s) = V_i(s) H(s) \quad [1]$$

where $H$ represents the sampling coefficient function.

Inverting expression [1] to the time domain ($t$) results in $$v_o(t) = L^{-1}(V_o(s)) = L^{-1}(V_i(s) H(s)) \quad [2]$$

or from convolution $$v_o(t) = \int_o^t h(T)v_i(t - T)dT \simeq T \sum_{m=0}^{k} h_m v_i(t - mT) \quad [3]$$

Figure 1:
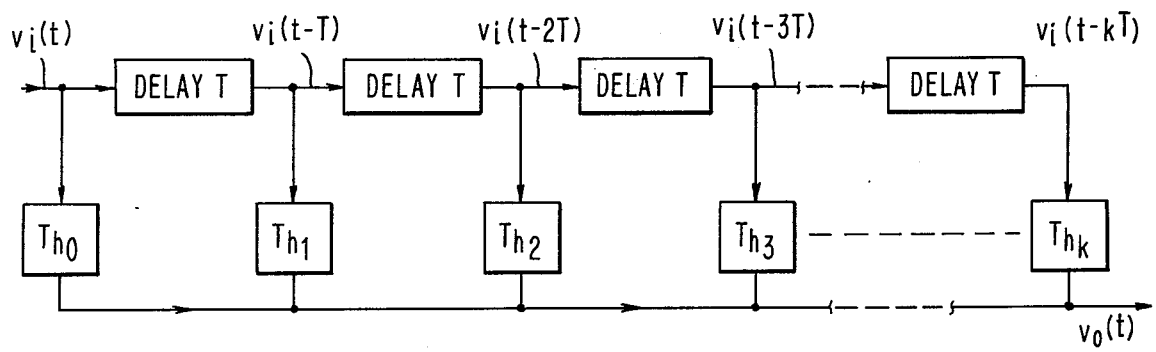
FIG. 1 is a schematic block diagram of a typical transversal filter configuration which is used in a description of the present invention.

The approximate summation expression [3] can be illustrated by the block diagram of the transversal filter of FIG. 1. As taught in the Buss et al. Publication, the filter of FIG. 1 can be implemented in charge transfer technology, either by charge-coupled-device or bucket brigade devices. However, as previously stated, techniques employed heretofore require precise tap weights over a wide range of values and they do not offer the ability to logic control the filter.

Figure 2:
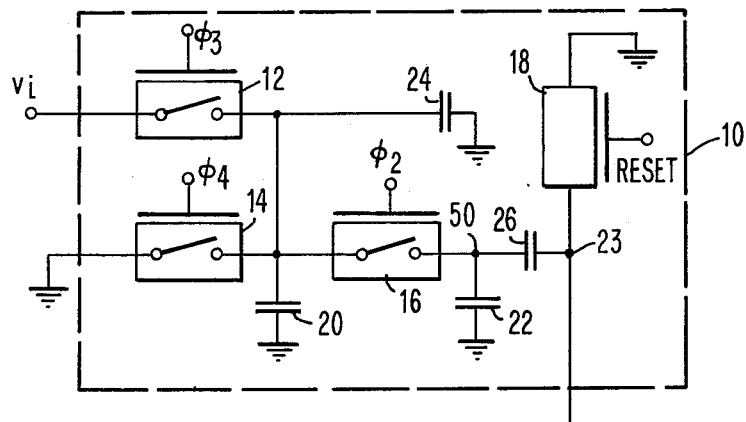
FIG. 2 is a schematic block diagram of one embodiment of a charge transfer transversal filter according to the principles of the present invention.
Figure 2:
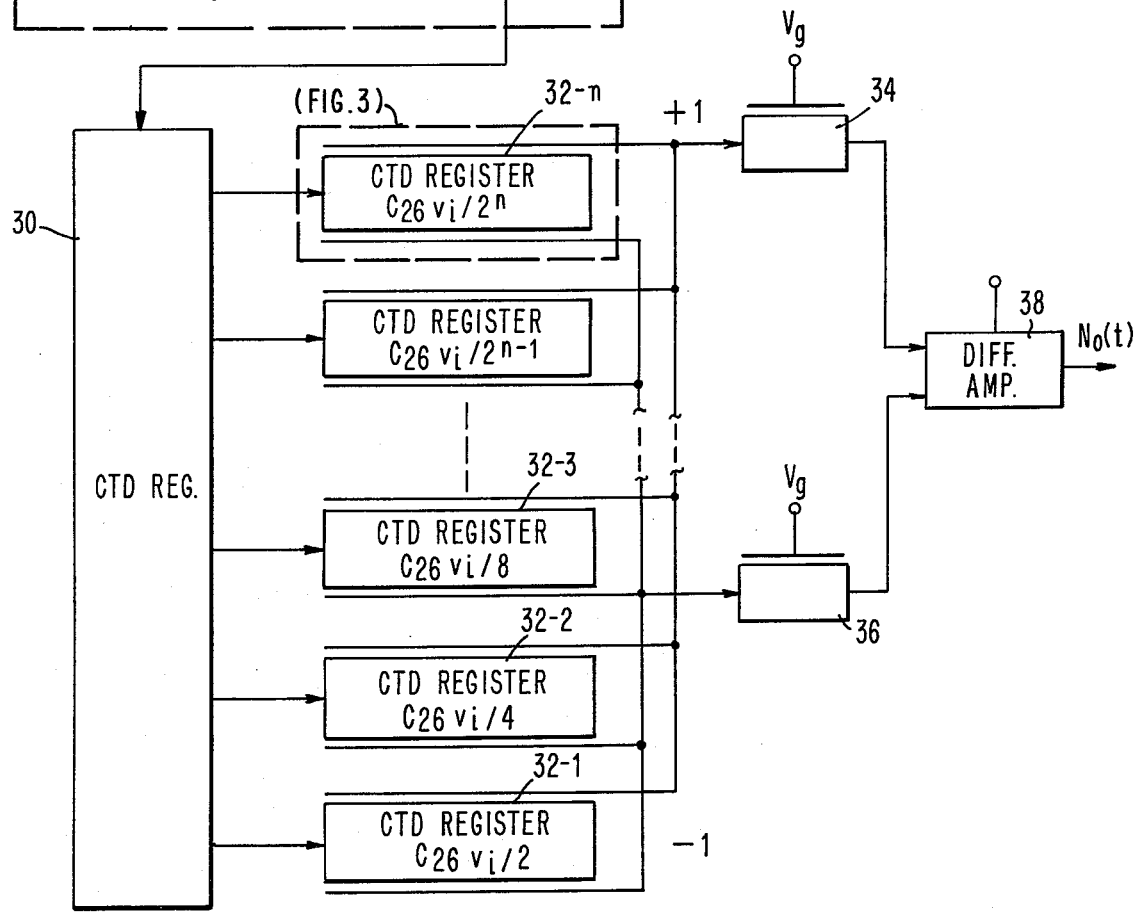

In the present invention, an embodiment for which is illustrated in FIG. 2, an input circuit 10 is provided including transistors 12, 14, 16 and 18 and capacitors 20, 22, 24 and 26. The input signal $v_i$ is the sampled analog signal. The input circuit 10 generates a sequence of charge packets for each of the sampled input signal values $v_i$ which is represented $$Q = C_{26}v_i/2, C_{26}v_i/4 \ldots C_{26}v_i/2^n \quad [4]$$

From expression [4] it is seen that the first charge packet generated is $C_{26}v_i$ divided by a factor of 2. In other applications it may be desired to begin the sequence with the original charge packet $C_{26}v_i$ as the first packet of the sequence. The charge packets generated by input circuit 10 are transferred or injected into charge transfer device register 30. The input circuit 10 is fully described in the previously mentioned copending patent application, Ser. No. 670,781. In describing the operation of input circuit 10 herein it is assumed that charge transfer register 10 includes an input or transfer transistor having a control electrode to which a phase pulse (phase 1) is applied having a value $V_g$. It is also assumed that input circuit 10 and the aforesaid input transfer transistor operate in combination with a conventional phase pulse generator which generates the various pulses phase 1, phase 2, phase 3 etc. which are applied to the control electrodes of its various transistors.

The circuit parameters of input circuit 10 of FIG. 2 can be understood from the following description of the operating cycle. Initially, at time $t_o$ the phase 1 pulse applied to the transfer transistor in CTD register 30 goes on to a d.c. level $V_g$ and remains on. The reset phase applied to transistor 18, phase 2 applied to transistor switch 16 and phase 3 applied to transistor 12 also go on at $t_o$. The reset phase applied to transistor 18 goes off at $t_1$ and node 23 charges up to $V_g$-$V_{th}$ through the input transistor within CTD register 30 where $V_{th}$ is the threshold value of input transistor which is operated in saturation.

Phase 2 goes off at $t_2$ and transistor switch 16 opens thereby isolating the node above capacitor 22 at a voltage $v_i$. At $t_3$, phase 3 drops, thereby turning transistor 12 off and phase 4 at transistor 14 turns on thereby discharging the node above capacitor 20 from $v_i$ to ground. At time $t_4$ the phase 4 pulse goes off thereby isolating the node above capacitor 20 at ground. Phase 2 then goes back on and the charge due to $v_i$ redistributes between the two nodes above capacitors 20 and 22 which means that the node above capacitor 22 is discharged to a level $v_i/2$ and a packet of associated charge $C_{26}v_i/2$ is injected into CTD register 30. Phase 2 then goes off at time $t_5$ opening switch 16 and phase 4 goes on again discharging the node above capacitor 20 back to ground through transistor 14. At time $t_6$ phase 4 at transistor 14 goes off again isolating the node above capacitor 20 at ground and phase 2 goes on closing switch 16 and the charge due to $v_i/2$ redistributes between the two nodes above capacitors 20 and 22 which means that the node 50 above capacitor 22 is discharged to a level $v_i/4$ and a packet of charge $C_{26}v_i/4$ is injected into the CTD register 30.

In like manner the input circuit 10 of FIG. 2 can continue to cycle to inject or transfer charge packets of $C_{26}v_i/8$, $C_{26}v_i/16$, $C_{26}v_i/32$ etc into CTD register 30. A feature of the circuit of FIG. 1 is that with capacitance 26 in series with capacitance 22, the resultant capacitance as seen by the CTD register 30 is less than either capacitance 22 or 26. Thus, capacitances 20 and 22 may be large for high accuracy whereas the effective capacitance for the circuit time constant is small permitting fast operation. Of course, other charge generator circuits may be used instead of the specific configuration 10 shown in FIG. 2.

Thus, the sequence [4] generated by input circuit 10 is shifted serially into the charge transfer register 30. Charge transfer register 30 stores a sequence of divided-by-factors of two charge packets representative of an input signal sample. Register 30 is a conventional device and there are many devices in the prior art which can be employed for the structure of register 30. One example of a suitable structure is described in the publication "Charge Coupled 8-Bit Shift Register" by M. F. Tompsett et al. in Applied Physics Letters, Vol. 17, 3, p.111. Aug. 8, 1970.

When each sequence of charge packets for each input signal sample is fully contained in register 30, the charge packets are transferred in parallel into a plurality n of charge transfer registers 32-1, 32-2 . . . 32-n wherein each register stores charge packets of the same fractional value for the various samples of the input signal. For example, register 32-3 stores all the charge packets from the input signal samples which have been divided by eight. Thus, the term "same fractional value" is defined herein to mean those charge packets which were divided by the same value even though the resultant value of the "same fractional value" are different.

A significant feature of the present invention is that registers 32-1 through 32-n now contain each input signal sample in the form of a plurality of charge packets in decreasing fractional amounts which may be selectively weighted after each unit of delay with weights of +1, −1, and 0 and the weights of the values in registers 32 summed. The procedure results in a precise implementation of the convolution sum indicated in expression [3].

Thus, by applying weights of +1, −1 or 0; any value of the weights $h_m$ of [3] multiplied by the delay values of $v_i(t-mt)$ in the form of charge can be summed to produce [3]. Therefore, as will be more fully illustrated, precise tapping weights are not required in the present invention, only tapping weights of +1, −1 and 0. The summing of the +1 and −1 weights can be implemented by using devices 34, 36 and 38 to perform a parallel replication as described in copending U.S. patent application Ser. No. 625,425 or by using integrating operational amplifiers. It should be clear that expression [3] can be produced by using on +1 and −1 weightings without 0 weighting with an inaccuracy comparable to $v_i/2^n$.

Figure 3:
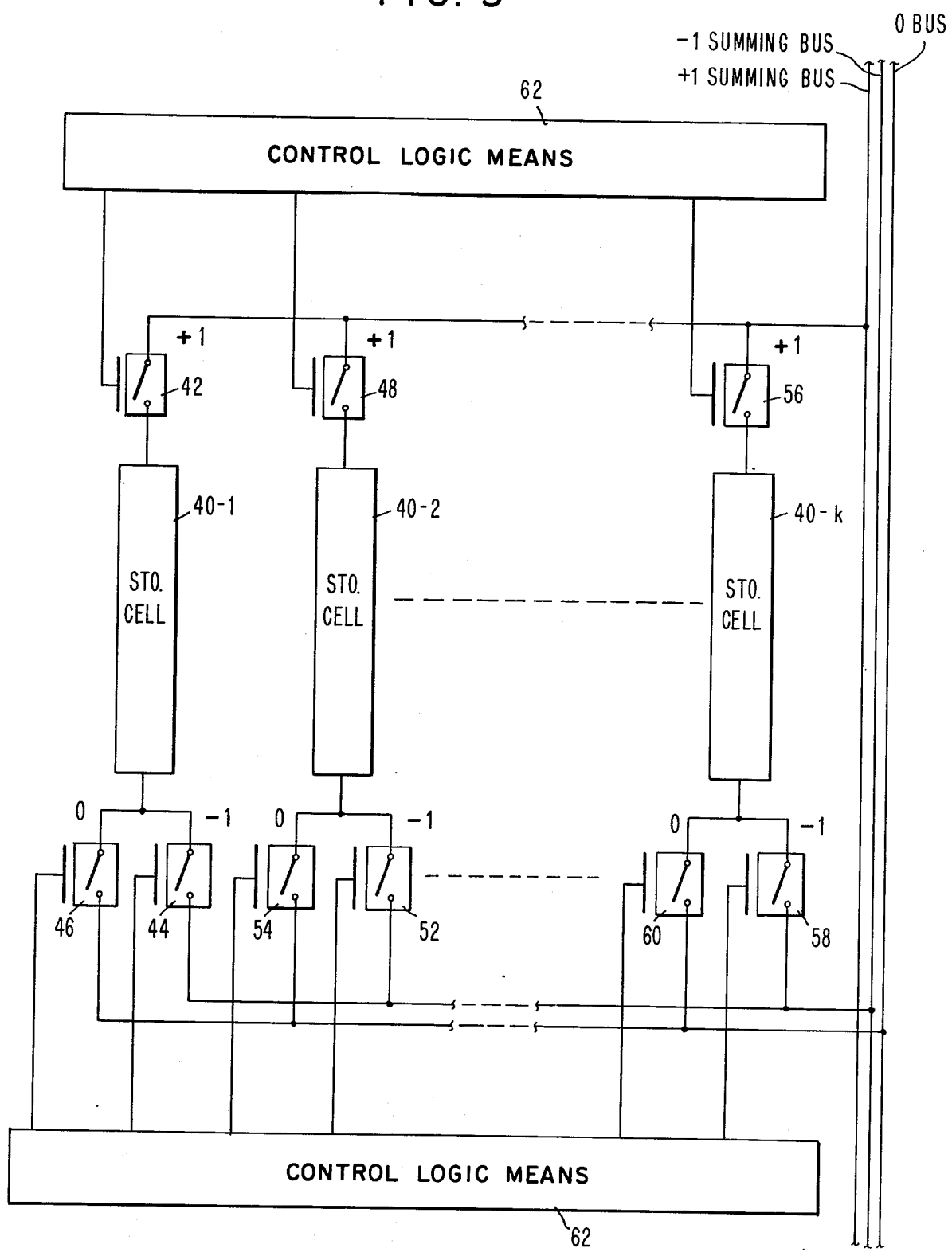
FIG. 3 is a schematic block diagram of an embodiment of a charge transfer register configuration which may be used in the structure of FIG. 2.

Referring to FIG. 3, a schematic block diagram of an embodiment of a typical one of the CTD registers 32-1 through 32-n is illustrated. Assuming that the input signal $v_i$ is sampled $k$ times, the register of FIG. 3 contains $k$ separate storage cells 40-1, 40-2 . . . 40-k with each storage cell containing a separate one of the charge packets produced by the time sampling and fractional dividing. Each of the storage cells 40-1, 40-2 . . . 40-k is connected to three FET switches 42, 44, 46 and 48, 52, 54, etc up to 56, 58 and 60. Each of the storage cells 40-1, 40-2 . . . 40-k are connected the same, for example, storage cell 40-1 is connected to a +1 tap through switch 42, to a −1 tap through switch 44 and to a 0 tap (if used) through switch 46. The FET switched are controlled through the control logic means 62.

Thus, by means of the CTD register illustrated in FIG. 3 used in n positions as shown in FIG. 2, the input signal $v_i$ which has already been both time sampled $k$ times and each time sample fractionally divided by $2^n$, each divided time sample can be selectively weighted by a factor +1, −1 or 0 and the results combined on the output buses to produce the relationship set forth in expression [3]. No precise weight values are required and the control logic means 62 can be operated by program control so that the filter characteristics can be changed or adapted (i.e. the tap weights can be changed) merely by applying different sets of input instructions to the control logic means 62.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A transversal filter comprising;
   a time sampled analog input signal including pluralities of sampled signal values,
   a charge redistribution means responsive to said sampled signal values in each of said input signal pluralities for dividing said sampled signal values into a separate sequence of n electrical charge packets of decreasing selected discrete fractional amounts for each one of said plurality of said sampled signal values, weighting means connected to said charge redistribution dividing means for applying positive or negative weighting values to selected ones of said fractional signal amounts in each of said sequences, and means connected to said weighting means for combining said weighted fractional signal amounts to produce an output signal which is representative of the said input signal modified by a filter transfer function.

2. A transversal filter according to claim 1 further including registration means connected intermediate said charge redistribution dividing means and said weighting means for organizing said selected fractional signal amounts into groups according to the same fractional value.

3. A transversal filter according to claim 2 wherein said registration means includes a plurality of storage registers connected to said charge redistribution circuit, separate ones of said registers storing said charge packets of said separate sequences having the same fractional value.

4. A charge transfer device transversal filter comprising:

a charge redistribution means responsive to a plurality of electrical signals representative of a time sampled analog input signal for producing a separate sequence of electrical charge packets of decreasing selected discrete fractional amounts for each of said plurality of electrical signals, a plurality of storage registers connected to said charge redistribution circuit, separate ones of said registers storing said charge packets of said separate sequences having the same fractional value, weighting means connected to said storage registers for applying positive or negative weighting value to selected ones of said fractional amounts of charge packets in said plurality of storage registers, and means connected to said plurality of storage registers for combining said weighted fractional amounts of charge packets to produce an output signal which is representative of the said input signal modified by a filter transfer function.

5. A charge transfer device transversal filter according to claim 4 wherein said electrical signals are a plurality of charge carrier packets $Q1, Q2, Q3 \ldots Qk$ and wherein said charge redistribution means includes a first electrical signal storage means adapted to store up to a predetermined quantity of electrical charge carriers, a second electrical signal storage means also adapted to store up to a predetermined quantity of electrical charge carriers, an electrical signal transfer means associated with said first and second electrical signal storage means for transferring from said first storage means to said second storage means and from said second storage means to said first storage means any selected amount of electrical charge carriers from said predetermined quantity of electrical charge carriers, said charge redistribution circuit producing a separate sequence of electrical charge packets:

$Q1/2, Q1/4, Q1/8 \ldots Q1/2^n, Q2/2, Q2/4, Q2/8 \ldots Q2/2^n; Q3/2, Q3/4, Q3/8 \ldots Q3/2^n; Qk/2, Qk/4, Qk/8 \ldots Qk/2^n.$ 6. A charge transfer device transversal filter according to claim 5 further including a first charge transfer device storage register having a plurality of $n$ storage cells for separately storing each of said sequences of electrical charge packets from said charge redistribution means, a plurality of $n$ charge transfer device storage registers having $k$ storage cells, said $n$ registers connected in paralled to said $n$ storage cells of said first register for storing said charge packets of said separate sequences having the same fractional value.

7. A charge transfer device transversal filter according to claim 6 wherein said weighting means connected to said storage registers includes a source of positive weighting signal, a source of negative weighting signal, and switching means connected to each cell of each of said $k$ cells of each of said $n$ registers for applying a positive or a negative weighting value to selected ones of said fractional amounts of charge packets in said $n$ storage registers, a first summing means for combining said positive weighted fractional amounts of charge packets, a second summing means for combining said negative weighted fractional amounts of charge packets, and a differencing circuit connected to said first and second summing means for producing a difference signal representative of the said input signal modified by a filter transfer function.

* * * * *